INVENTORS.
GLEN R. HEIDLER
RALPH SAUNDERS
BY
Samuel Kane
ATTORNEY

INVENTORS.
GLEN R. HEIDLER
RALPH SAUNDERS
BY
Samuel Stone
ATTORNEY

United States Patent Office 3,501,582

Patented Mar. 17, 1970

3,501,582

ELECTRICAL ASSEMBLY

Glen R. Heidler, Paoli, and Ralph Saunders, Havertown, Pa., assignors to Burroughs Corporation, Detroit, Mich., a corporation of Michigan Filed Apr. 18, 1968, Ser. No. 722,422

Int. Cl. H05k *3/30, 5/06*

U.S. Cl. 174—52 5 Claims

ABSTRACT OF THE DISCLOSURE

An electrical substrate containing flat conductors and electrical components is provided with electrical connectors which in one form afford horizontal mounting of the substrate and in another form affords vertical mounting of the substrate. In either case, the substrate with its attached connectors is inserted into a housing. The housing is then filled with an electrical insulating encapsulating material to an extent so as to leave the connector terminals exposed, and so as to rigidly secure and protect the substrate and connectors.

BACKGROUND OF THE INVENTION

This invention relates generally to electrical and electronic packages, and more particularly to miniature substrates and miniature connectors, and to means for aligning and packaging such elements in a protective housing.

So far as is known, there is no reliable electrical connection to a substrate which contains flat or film-type conductors. Presently known techniques do not appear to have taken into account the fact that an electrical connection alone is inadequate. Means must also be provided to protect the substrate and the connections against breakage, and to prevent the flat substrate circuitry from peeling away from the substrate.

SUMMARY OF THE INVENTION

An object of the invention is to provide reliable connections to substrates.

Another object of the invention is to provide reliable connections to substrates which contain film-type or flat conductors.

A further object of the invention is to provide an electrical assembly for substrates which affords maximum protection against breakage.

Still a further object of the invention is to provide such an assembly which results in reliable connections to substrates and which protects both the substrates and the connections.

Another object of the invention is to provide a connection means for substrates which also serves to align the substrates in their individual assemblies.

A more specific object of the invention is to provide an electrical package for miniature substrates.

Still a further object of the invention is to provide a miniature reliable connector for frail or brittle miniature substrates.

Another object of the invention is to provide an electrical connector which can be formed so as to afford either horizontal or vertical mounting of substrates.

Still a further object of the invention is to provide an electrical assembly which is simple to fabricate and inexpensive to manufacture.

In accordance with the above objects, and considered first in one of its broader aspects, the invention comprises a miniature panel of electrical insulating material provided with flat conductors on one of its major surfaces and connecting areas on the other of its major surfaces. Each conductor and each connecting area has a portion adjacent to a margin of the panel. A plurality of miniature conductive connectors are provided each comprising first and second substantially parallel fingers which embrace a margin of the panel so that the first finger is adjacent to an associated one of the conductor portions, and the second finger is adjacent to an associated one of the connecting area portions, and a terminal for electrical connection to associated apparatus. Means is provided for electrically connecting the first fingers to the associated conductor portions, and further means is provided for connecting the second fingers to the associated connecting area portions.

The invention will be more clearly understood when the detailed description, which follows shortly, is read in conjunction with the accompanying drawings which are described below.

DESCRIPTION OF THE PREFERRED EMBODIMENTS

Figure 1:
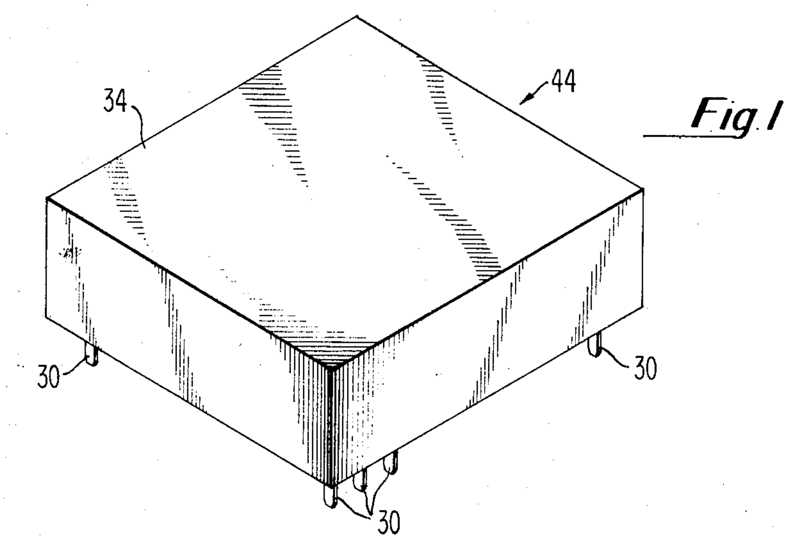
FIG. 1 is an enlarged isometric view of a miniature electrical assembly constructed in accordance with the invention.
Figure 4:
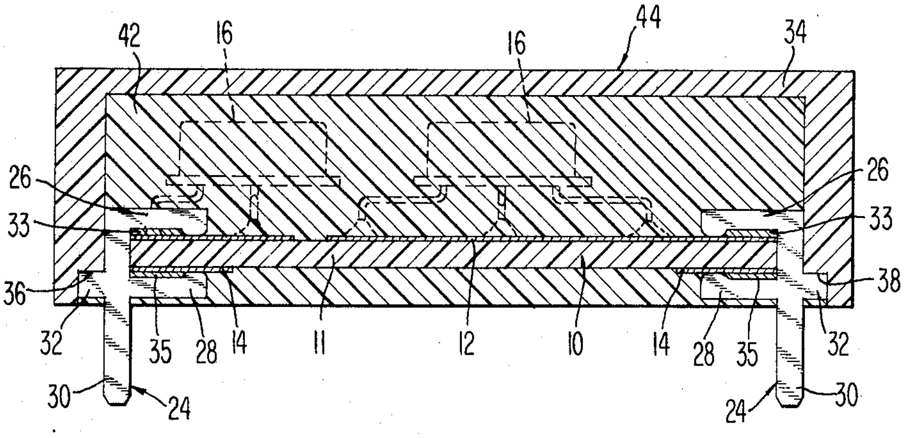
FIG. 4 is a sectional view taken along line 4—4 of FIG. 2.
Figure 2:
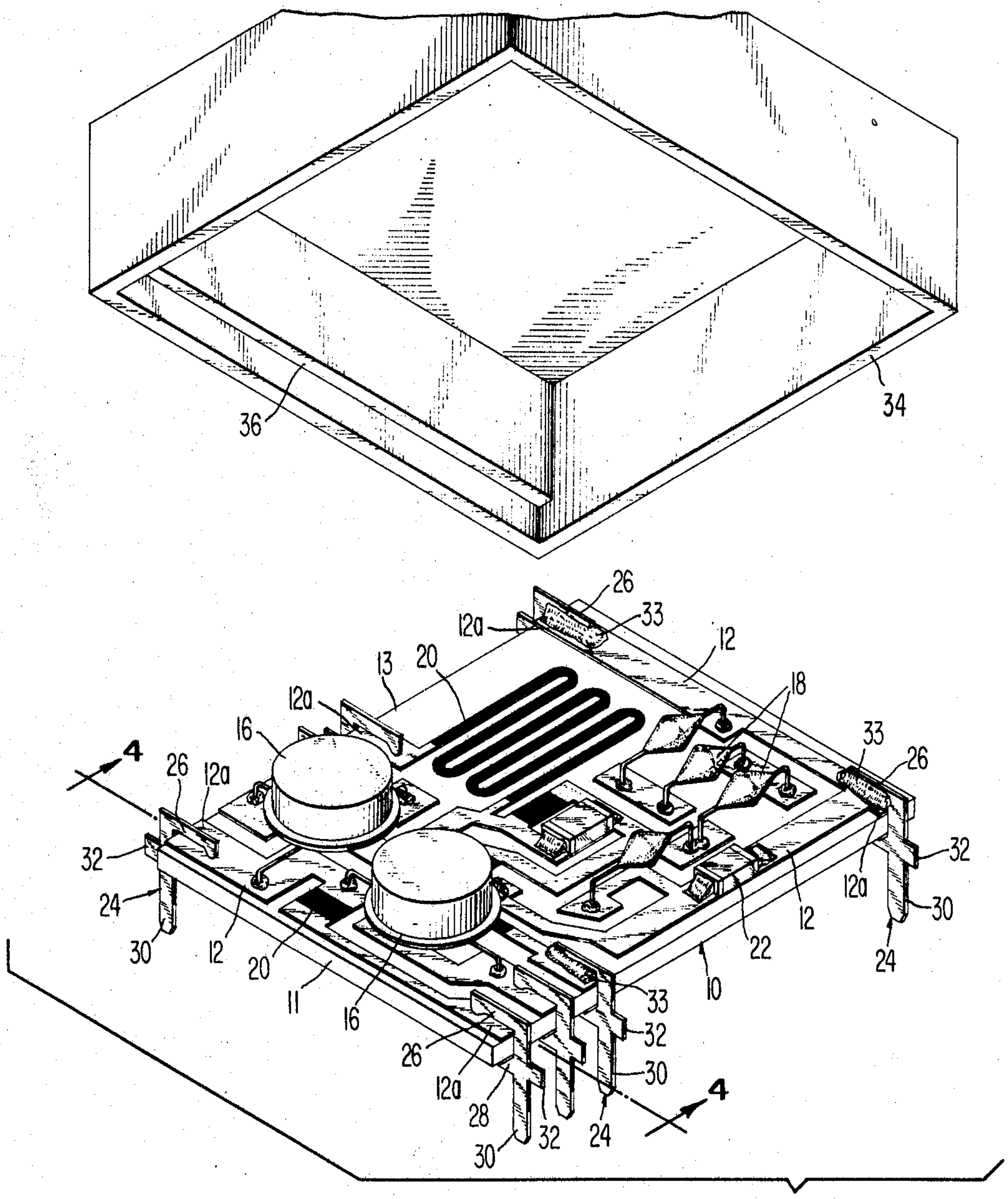
FIG. 2 is an exploded view of the assembly of FIG. 1.
Figure 3:
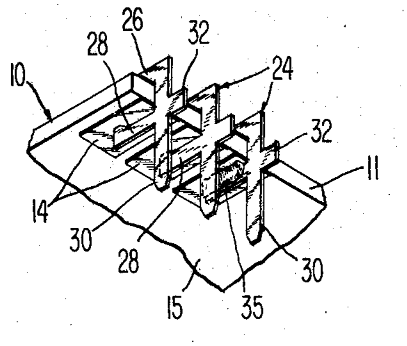
FIG. 3 is an isometric view of a fragment of the apparatus.

In the drawings, there is illustrated a miniature substrate 10 (FIGS. 2–4) comprising a panel 11 of electrical insulating material provided on one side 13 with a plurality of flat or film-type conductors 12 (FIG. 2), and on the other side 15 (FIG. 3) with a plurality of connecting areas 14. In a particular miniaturized electrical assembly which was constructed, the panel 11 was formed of a ceramic material 0.025 inch thick, 0.700 inch wide, and 0.900 inch long. Other panels 11 of similar dimensions were constructed of glass.

The connecting areas 14 may simply be areas of the back surface 15 of the insulating panel 11 or, as shown, they may consist of pads of connecting material such as metallic pads, for example, deposited on the panel. Electrical components such as transistors 16, diodes 18, resistors 20 and a capacitor 22, for example, are illustratively electrically connected to the conductors 12, in accordance with the particular circuit requirements.

Depending upon the particular circuit in which the substrate 10 is to be used, the back surface 15 of the panel 11 may alternatively be provided with electrical conductors similar to the conductors 12, or it may be fully clad with a conductive sheet, such as a ground plane. In such applications, portions of the conductors, or of the ground plane, would provide connecting areas such as 14.

Mounted on opposed margins of the substrate 10 are electrical connectors 24, each of which comprises a pair of substantially parallel spring fingers 26 and 28 which pinchingly grip the substrate 10. Each connector 24 is further provided with an elongate terminal 30, which is substantially perpendicular to the fingers 26 and 28, and with an aligning projection 32.

The fingers 26 may be adjacent to, but preferably they overlap and are in contact with, the connecting portions 12*a* of certain of the conductors 12 and are electrically connected to these portions, as by means of solder 33, for example. In the illustrated embodiment, the fingers 28 are also similarly connected, as by means of solder 35, to the respective connecting areas 14 which they also preferably overlap. Whenever the connecting areas 14 are not part of the circuitry, the fingers 28 may be connected to these areas by means of any suitable conductive or nonconductive bonding material, as desired. To simplify the drawings, solders 33 and 35 have only been shown in a few places at the fingers 26 and 28.

The substrate 10, together with the connectors 24 secured in place, is inserted into a housing 34 provided with stop shoulders 36 and 38, and aligned in the housing when the projections 32 abut the stop shoulders. Electrical insulating hardenable encapsulating material 42 is then poured or otherwise introduced into the housing 34 to encase the substrate 10 and the connector fingers 26 and 28, and so as to leave exposed the terminals 30. Upon hardening of the encapsulating material 42, the assembly 44 becomes a rigid protected unit and is suitable for plug-in insertion of the terminals 30 into a printed circuit board, or the like, for horizontal mounting of the substrate 10, or for other types of connection to associated electrical apparatus.

Figure 5:
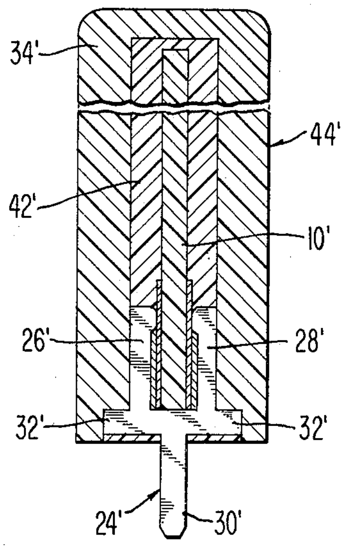
FIG. 5 is a sectional view of a modification of the invention.

A variation of the invention is illustrated in FIG. 5 in which the connectors 24' and housing 34' are constructed for vertical mounting of the substrate 10'. In this modification, the housing 34' is relatively narrower and deeper, and the terminals 30' are substantially parallel to the fingers 26' and 28'. Each connector is also provided with two projections 32', one on each side of the connector.

While there have been shown and described specific assemblies to examplify the principles of the invention, it is to be understood that these are preferred embodiments of the invention, and that the invention is capable of being constructed in a variety of shapes, sizes and modifications without departing from the true spirit and scope thereof. Accordingly, the invention is not to be limited by the specific electrical assemblies disclosed, but only by the subjoined claims.

What is claimed is:

1. An electrical assembly comprising a subassembly and a housing fixedly containing said subassembly, said subassembly comprising a miniature panel of electrical insulating material provided with flat conductors on one of its major surfaces and connecting areas on the other of its major surfaces, each conductor and connecting area having a portion adjacent to a margin of the panel, a plurality of miniature conductive connectors each comprising first and second substantially parallel resilient fingers which embrace and pinchingly grip a margin of the panel so that the first finger is in contact with an associated one of said conductor portions and the second finger is in contact with an associated one of said connecting area portions, each of said connectors including a terminal for electrical connection to associated apparatus and an aligning surface, means for electrically connecting said first fingers to the associated conductor portions, and means for connecting said second fingers to the associated connecting area portions, said housing having side walls and an open end into which said subassembly is inserted and stop shoulders in opposite side walls located inwardly from said open end, each of said aligning surfaces abutting one of said stop shoulders.

2. An electrical assembly according to claim 1 wherein each of said terminals is elongate and substantially perpendicular to the fingers of its associated connector.

3. An electrical assembly according to claim 2 characterized further by the provision of electrical insulating encapsulating material filling said housing to an extent so that each of said terminals is exposed.

4. An electrical assembly according to claim 1 wherein each of said terminals is elongate and substantially parallel to the fingers of its associated connector.

5. An electrical assembly according to claim 4 characterized further by the provision of electrical insulating encapsulating material filling said housing to an extent so that each of said terminals is exposed.

References Cited

UNITED STATES PATENTS

| | | | |
|---|---|---|---|
| 2,962,692 | 11/1960 | White. | |
| 3,140,907 | 7/1964 | Davies. | |
| 3,158,418 | 11/1964 | Rush | 339—17 |
| 3,290,637 | 12/1966 | Yuska. | |
| 3,328,781 | 6/1967 | Robey et al. | |

DARRELL L. CLAY, Primary Examiner

U.S. Cl. X.R.

317—101